(12) United States Patent
Fukuchi

(10) Patent No.: US 11,574,852 B2
(45) Date of Patent: Feb. 7, 2023

(54) MOUNTING STRUCTURE FOR HEATER ELEMENT, METHOD FOR MOUNTING HEATER ELEMENT, AND POWER CONVERSION DEVICE

(71) Applicant: FUJI ELECTRIC CO., LTD., Kawasaki (JP)

(72) Inventor: Shun Fukuchi, Suzuka (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 143 days.

(21) Appl. No.: 17/208,404

(22) Filed: Mar. 22, 2021

(65) Prior Publication Data

US 2021/0327784 A1 Oct. 21, 2021

(30) Foreign Application Priority Data

Apr. 17, 2020 (JP) .............................. JP2020-074032

(51) Int. Cl.
| | | |
|---|---|---|
| *H01L 23/40* | (2006.01) | |
| *H01L 25/11* | (2006.01) | |
| *H01L 23/433* | (2006.01) | |
| *H05K 1/18* | (2006.01) | |
| *H01L 23/00* | (2006.01) | |

(52) U.S. Cl.
CPC ........ *H01L 23/4093* (2013.01); *H01L 23/433* (2013.01); *H01L 24/72* (2013.01); *H01L 24/90* (2013.01); *H01L 25/115* (2013.01); *H05K 1/18* (2013.01); *H05K 2201/10166* (2013.01); *H05K 2201/10424* (2013.01); *H05K 2201/10454* (2013.01); *H05K 2201/10901* (2013.01)

(58) Field of Classification Search
CPC .................................................. H01L 23/4093
USPC ......................................................... 257/712
See application file for complete search history.

(56) References Cited

U.S. PATENT DOCUMENTS

2013/0092938 A1* 4/2013 Knickerbocker ..... H01L 23/544
257/698

FOREIGN PATENT DOCUMENTS

JP 2001-326442 A 11/2001

* cited by examiner

*Primary Examiner* — Ajay Arora
(74) *Attorney, Agent, or Firm* — Manabu Kanesaka

(57) ABSTRACT

A mounting structure for a heater element includes a heater element having a surface to be cooled, a board on which the heater element is mounted, a cooling member that cools the surface to be cooled of the heater element mounted on the board, and a supporting member temporarily fixed to the board, the supporting member temporarily fixing the heater element.

12 Claims, 6 Drawing Sheets

MOUNTING STRUCTURE FOR HEATER ELEMENT, METHOD FOR MOUNTING HEATER ELEMENT, AND POWER CONVERSION DEVICE

CROSS-REFERENCE TO RELATED APPLICATION

The present application claims priority of Japanese Patent Application No. 2020-074032 filed Apr. 17, 2020, the disclosure of which is hereby incorporated by reference.

BACKGROUND OF THE INVENTION

Field of the Invention

The present invention relates to a mounting structure for a heater element, a method for mounting a heater element, and a power conversion device.

Description of the Background Art

A FET mounting structure for mounting a field effect transistor (FET) on a circuit board is known in general, as disclosed in Japanese Patent Laid-Open No. 2001-326442, for example.

Japanese Patent Laid-Open No. 2001-326442 discloses a configuration in which a FET is mounted on a surface of a circuit board via a resin plate. A guide hole is provided in this resin plate, and a lead terminal of the FET is inserted while being guided by the guide hole. The resin plate on which the FET has been mounted is fixed to the board by fixing screws. In the FET mounting structure described in Japanese Patent Laid-Open No. 2001-326442, the FET mounted on the resin plate is pushed such that the lead terminal of the FET is inserted into an insertion portion of the circuit board. A radiator plate is mounted on a surface of the FET opposite to the resin plate with respect to the FET by fixing screws.

Although in the FET mounting structure described in Japanese Patent Laid-Open No. 2001-326442, the lead terminal of an element such as the FET is inserted into the guide hole of the resin plate, the element is not fixed to the board, and the arrangement of the element conceivably becomes unstable. When the radiator plate (cooling member) is mounted on a surface of the element opposite to the board with respect to the element (heater element) such as the FET as in the FET mounting structure described in Japanese Patent Laid-Open No. 2001-326442, operation to fix the cooling member is performed in a state in which the top and bottom of the board is reversed. In this case, the lead terminal of the heater element conceivably falls out of the guide hole of the resin plate due to gravity. Also when operation to assemble the resin plate into which the lead terminal of the heater element is inserted to the board is performed, the arrangement of the heater element on the board becomes unstable, and thus the heater element conceivably falls out of the board during the assembly operation. Thus, when the heater element is arranged on the board, the heater element may disadvantageously fall out of the board.

SUMMARY OF THE INVENTION

The present invention has been proposed in order to solve the aforementioned problem, and an object of the present invention is to provide a mounting structure for a heater element, a method for mounting a heater element, and a power conversion device capable of facilitating assembly operation while significantly reducing or preventing the possibility that the heater element falls out of a board when the heater element is arranged on the board.

In order to attain the aforementioned object, a mounting structure for a heater element according to a first aspect of the present invention includes a heater element having a surface to be cooled, a board on which the heater element is mounted, a cooling member that cools the surface to be cooled of the heater element mounted on the board, and a supporting member temporarily fixed to the board, the supporting member temporarily fixing the heater element.

As described above, the mounting structure for a heater element according to the first aspect of the present invention includes the supporting member temporarily fixed to the board, the supporting member temporarily fixing the heater element. Accordingly, the supporting member is temporarily fixed at a predetermined position of the board in a state in which the heater element has been temporarily fixed by the supporting member, and thus the heater element can be arranged at the predetermined position of the board in the state in which the heater element has been temporarily fixed. Therefore, the heater element that has been temporarily fixed is arranged on the board such that the possibility that a lead terminal of the heater element falls out of the board can be significantly reduced or prevented, and the heater element can be easily arranged at the predetermined position of the board. Consequently, when the heater element is arranged on the board, assembly operation can be facilitated while the possibility that the heater element falls out of the board is significantly reduced or prevented.

In the aforementioned mounting structure for a heater element according to the first aspect, the supporting member preferably includes a board mount detachably and temporarily fixed to the board, and the board mount is preferably temporarily fixed to the board such that a predetermined play is provided between a hole and the board mount. Accordingly, the board mount is temporarily fixed to the board such that the predetermined play is provided between the hole formed on the board and the board mount, and thus the supporting member can be temporarily fixed to the board in a state in which the supporting member is movable for a distance corresponding to the predetermined play with respect to the board. Therefore, the supporting member is temporarily fixed to the board in a movable state such that the heater element temporarily fixed to the supporting member can be arranged at the predetermined position of the board in a movable state with respect to the board. Consequently, even when the shape of the lead terminal of the heater element varies due to fabrication tolerance during manufacturing or deformation during transportation and storage, the heater element can be moved closer to the cooling member, and thus the heater element can be effectively cooled.

In the aforementioned mounting structure for a heater element according to the first aspect, the supporting member preferably has a snap-fit structure to temporarily fix the heater element such that a predetermined play is provided between the heater element and the supporting member. Accordingly, the heater element has the snap-fit structure to temporarily fix the heater element, and thus the heater element can be easily temporarily fixed as compared with a case in which the heater element is temporarily fixed by a fastening member such as a screw.

In this case, the supporting member preferably includes an elastic leg including a protrusion, and the elastic leg preferably has a snap-fit structure in which the protrusion fits into a recess formed in advance on the heater element to temporality fix the heater element such that a predetermined play is provided between the heater element and the elastic leg. Accordingly, the protrusion of the elastic leg fits into the recess formed in advance on the heater element such that the heater element can be reliably held. Furthermore, the protrusion of the elastic leg fits into the recess of the heater element such that the possibility that the lead terminal of the heater element falls out of the board can be effectively significantly reduced or prevented. Moreover, the heater element is temporarily fixed such that the predetermined play is provided between the heater element and the elastic leg, and thus the surface to be cooled of the heater element is moved to a position at which the heater element is cooled by the cooling member such that the heater element can be effectively cooled while the possibility that the lead terminal of the heater element falls out of the board is effectively significantly reduced or prevented.

In the aforementioned mounting structure for a heater element according to the first aspect, the heater element is preferably a semiconductor element, and is preferably mounted on the board included in a power conversion device that performs power conversion by being temporarily fixed by the supporting member. Accordingly, even when the heater element is a semiconductor element mounted on the board included in the power conversion device that performs power conversion, operation to assemble the power conversion device can be facilitated while the possibility that the heater element falls out of the board is significantly reduced or prevented.

In the aforementioned mounting structure for a heater element according to the first aspect, the supporting member preferably stands upright from the board, and temporarily fixes the heater element such that the surface to be cooled of the heater element is along a direction perpendicular to main surfaces of the board. Accordingly, when a cooling surface of the cooling member is arranged along the direction perpendicular to the main surfaces of the board, the surface to be cooled of the heater element can be arranged at the position at which the heater element is cooled by the cooling surface of the cooling member. Therefore, even when the cooling surface of the cooling member is arranged in the direction perpendicular to the main surfaces of the board, the heater element can be effectively cooled.

In this case, the supporting member preferably includes a board mount detachably and temporarily fixed to the board, the board mount including a wedge-shaped protrusion at a tip end thereof, and the wedge-shaped protrusion preferably passes through an elongated hole formed on the board to have a predetermined play provided between the elongated hole and the board mount such that the board mount is temporarily fixed to the board. Accordingly, the predetermined play is provided between the elongated hole formed on the board and the board mount, and thus the surface to be cooled of the heater element can be moved to the position at which the heater element is cooled by the cooling member by moving the board mount along the elongated hole. Therefore, the board mount is moved along the elongated hole formed on the board, and thus the moving direction of the board mount can be constant. Consequently, the surface to be cooled of the heater element can be easily moved to the position at which the heater element is cooled by the cooling surface of the cooling member.

In the aforementioned mounting structure for a heater element according to the first aspect, the supporting member is preferably provided along the board, and preferably temporarily fixes the heater element such that the surface to be cooled of the heater element is along a direction parallel to main surfaces of the board. Accordingly, when the cooling surface of the cooling member is arranged along the direction parallel to the main surfaces of the board, the surface to be cooled of the heater element can be arranged at the position at which the heater element is cooled by the cooling surface of the cooling member. Therefore, even when the cooling surface of the cooling member is arranged in the direction parallel to the main surfaces of the board, the heater element can be effectively cooled.

In this case, the supporting member preferably includes a board mount detachably and temporarily fixed to the board, the board mount including a wedge-shaped protrusion at a tip end thereof, and the wedge-shaped protrusion preferably passes through a hole formed on the board to have a predetermined play is provided between the hole and the wedge-shaped protrusion such that the board mount is temporarily fixed to the board. Accordingly, the predetermined play is provided between the hole formed on the board and the protrusion, and thus the supporting member can be moved along the direction perpendicular to the main surfaces of the board. Therefore, the supporting member can be easily moved in the direction perpendicular to the main surfaces of the board while movement of the board mount in the direction parallel to the main surfaces of the board is significantly reduced or prevented by the hole provided on the board. Consequently, the moving direction of the board mount can be constant, and thus the surface to be cooled of the heater element can be easily moved to the position at which the heater element is cooled by the cooling surface of the cooling member.

In the aforementioned mounting structure for a heater element according to the first aspect, the supporting member preferably includes a plurality of supporting members provided along a cooling surface of the cooling member. Accordingly, the plurality of supporting members provided along the cooling surface of the cooling member allows a plurality of heater elements to be arranged along the cooling surface of the cooling member. Therefore, even when the plurality of heater elements is arranged on the board, the plurality of heater elements can be easily arranged at positions at which the heater elements are cooled by the cooling member.

A method for mounting a heater element according to a second aspect of the present invention includes temporarily fixing a supporting member to a first surface of main surfaces of a board, temporarily fixing a heater element including a surface to be cooled to the supporting member, arranging, on a side of the first surface of the main surfaces of the board, a cooling member that cools the surface to be cooled of the heater element, temporarily fixing the supporting member to the board and temporarily fixing the heater element to the supporting member, fixing the heater element with a lead terminal inserted into a through-hole formed on the board so that heat is transferable to the cooling member, and soldering, to a second surface of the main surfaces of the board, the lead terminal of the heater element fixed in the state in which heat is transferable to the cooling member.

In the method for mounting a heater element according to the second aspect of the present invention, as described above, the supporting member is temporarily fixed to the board, and the heater element is temporarily fixed to the supporting member such that the heater element with the lead terminal inserted into the through-hole formed on the board is fixed in the state in which heat is transferable to the cooling member. Then, the lead terminal of the heater element fixed in the state in which heat is transferable to the cooling member is soldered to the second surface of the main surfaces of the board. Accordingly, the heater element can be soldered in a state in which the heater element is temporarily fixed to the supporting member and arranged on the board, and thus an operator can solder the heater element to the board in a state in which the heater element is stably arranged on the board. Therefore, the heater element can be soldered in a state in which the possibility that the lead terminal of the heater element falls out of the board is significantly reduced or prevented. Thus, it is possible to provide the method for mounting the heater element that facilitates assembly operation while significantly reducing or preventing the possibility that the heater element falls out of the board when the heater element is arranged on the board. Furthermore, the heater element can be arranged at a position at which the heater element is cooled by the cooling member before the soldering, and thus movement (urging) of the heater element to the position for cooling after the soldering can be significantly reduced or prevented. Therefore, application of a stress to the solder due to movement of the heater element after the soldering can be significantly reduced or prevented. Consequently, assembly can be performed such that a stress is not applied to the solder, and thus a burden on the connection between the heater element and the board can be effectively significantly reduced or prevented.

A power conversion device according to a third aspect of the present invention includes a heater element including a surface to be cooled, a board on which the heater element is mounted, a cooling member that cools the surface to be cooled of the heater element mounted on the board, and a supporting member temporarily fixed to the board, the supporting member temporarily fixing the heater element.

As described above, the power conversion device according to the third aspect of the present invention includes the supporting member temporarily fixed to the board, the supporting member temporarily fixing the heater element. Accordingly, the supporting member is temporarily fixed at a predetermined position of the board in a state in which the heater element has been temporarily fixed by the supporting member, and thus the heater element can be arranged at the predetermined position of the board in the state in which the heater element has been temporarily fixed. Therefore, the heater element that has been temporarily fixed is arranged on the board such that the possibility that a lead terminal of the heater element falls out of the board can be significantly reduced or prevented, and the heater element can be easily arranged at the predetermined position of the board. Consequently, when the heater element is arranged on the board, assembly operation can be facilitated while the possibility that the heater element falls out of the board is significantly reduced or prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are hereinafter described with reference to the drawings.

First Embodiment

The configuration of a power conversion device 100 in which a mounting structure for a heater element is provided according to a first embodiment is now described with reference to FIGS. 1 to 4. The power conversion device 100 is an inverter device mounted on an electric vehicle. The electric vehicle is a vehicle such as an electric car equipped with a high-voltage battery.

Figure 1:
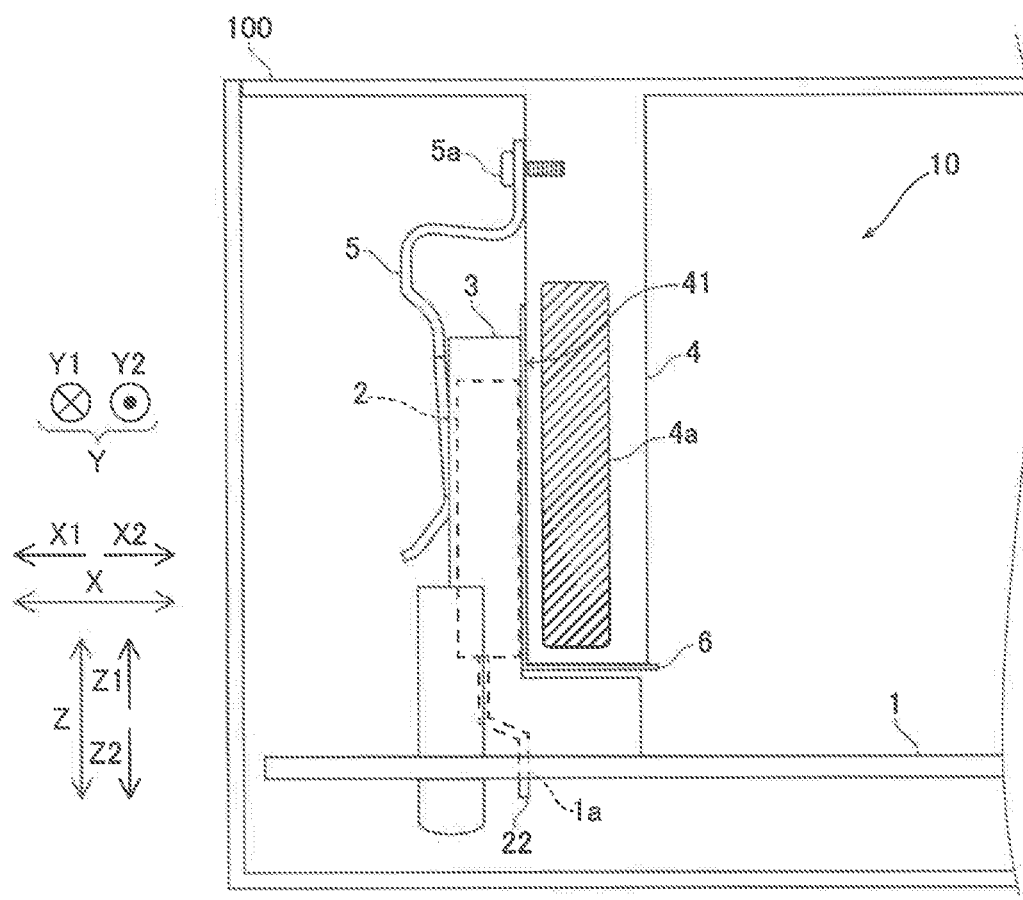
FIG. 1 is a side view showing the configuration of a power conversion device in which a mounting structure for a heater element is provided according to a first embodiment.

As shown in FIG. 1, the power conversion device 100 according to the first embodiment includes a power converter 10 that performs power conversion operation to convert DC power into AC power. The power converter 10 includes a board 1, a plurality of heater elements 2, a supporting member 3, a cooling member 4, an urging member 5, and a thermally conductive sheet 6.

Figure 2:
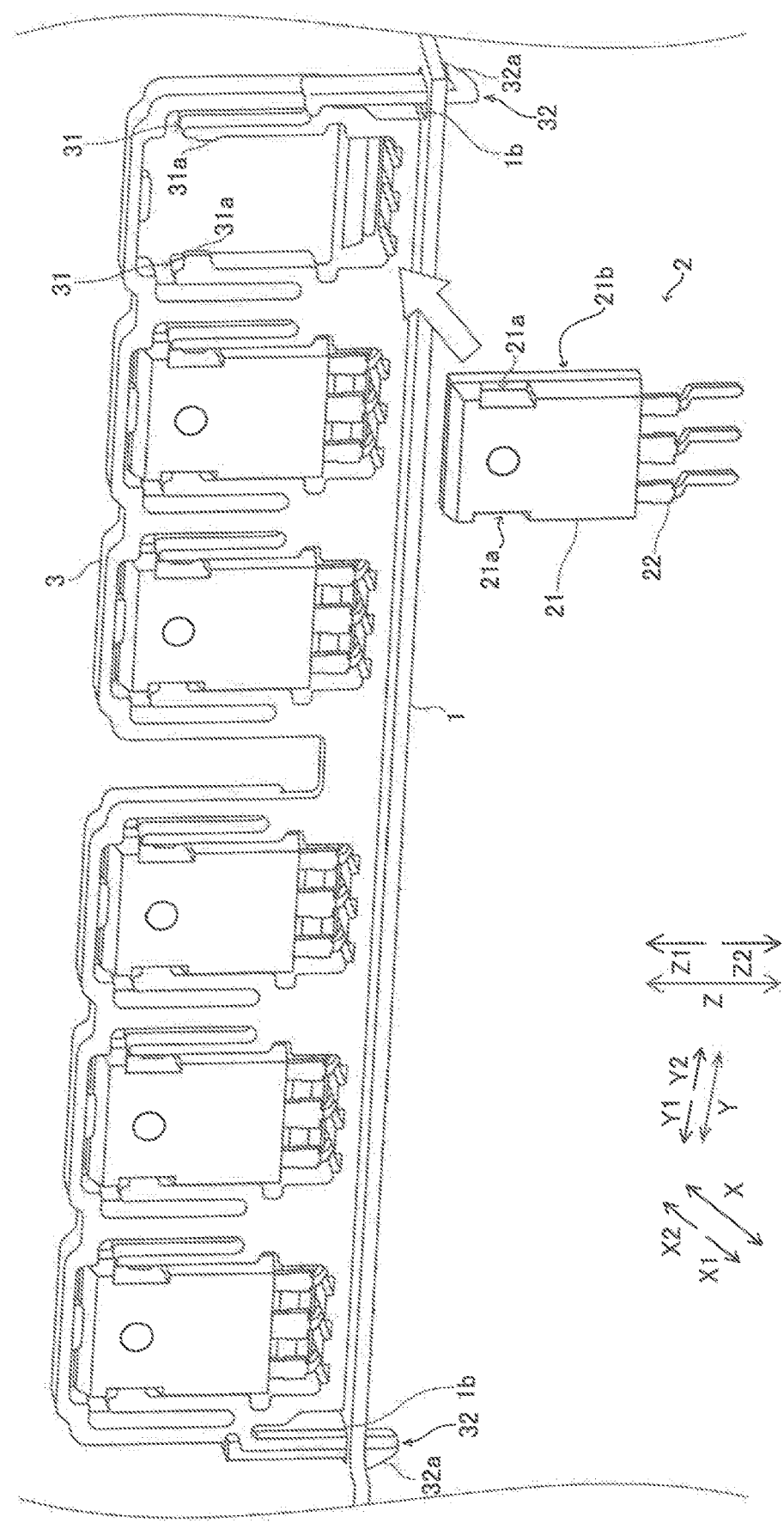
FIG. 2 is a perspective view for illustrating the configuration of a supporting member according to the first embodiment.

The board 1 is a printed board. The board 1 is included in the power converter 10 of the power conversion device 100 that performs power conversion. The heater elements 2 are mounted on the board 1. Specifically, the plurality of heater elements 2 is electrically connected to the board 1 by soldering. The board 1 includes through-holes 1a into which lead terminals 22 of the heater elements 2 described below are inserted. As shown in FIG. 2, the board 1 includes elongated holes 1b formed at predetermined positions of the board 1 such that board mounts 32 of the supporting member 3 described below are detachably inserted thereinto. The holes 1b pass through main surfaces (surfaces along an XY plane) of the board 1 in a Z direction, and have elongated openings that extend in an X direction.

The heater elements 2 constitute the power converter 10. That is, the heater elements 2 are mounted on the board 1 included in the power converter 10 by being temporarily fixed by the supporting member 3. The heater elements 2 are electronic components for performing power conversion. The heater elements 2 are semiconductor elements (switching elements) each including an insulated gate bipolar transistor (IGBT). The heater elements 2 generate heat by switching.

As shown in FIG. 2, each of the heater elements 2 includes a flat rectangular parallelepiped body 21 and three lead terminals 22 connected to the board 1 by being inserted into the through-holes 1a formed on the board 1. Recesses 21a into which elastic legs 31 of the supporting member 3 described below fit are formed in advance on an outer surface portion of the body 21. Furthermore, the heater element 2 has, on a back surface (a surface on the X2 side) of the body 21, a surface to be cooled 21b that is cooled by a cooling surface 41 of the cooling member 4 described below. That is, the cooling surface 41 of the cooling member 4 cools the surface to be cooled 21b to cool the heater element 2.

As shown in FIG. 1, the cooling member 4 is a portion of a housing of the power conversion device 100. That is, the cooling member 4 is a portion of the housing in which the power converter 10 is arranged. A flow path 4a through which cooling water for cooling the heater elements 2 flows is provided inside the cooling member 4. That is, the power conversion device 100 is a water-cooled device including the heater elements 2 cooled with cooling water. Although not shown, the flow path 4a includes an inflow port into which cooling water circulating in the electric vehicle flows, and an outflow port from which cooling water heated when the heater elements 2 are cooled flows out. The heated cooling water is cooled by a heat radiator (not shown).

The cooling member 4 cools the surface to be cooled 21b (see FIG. 2) of the heater element 2 mounted on the board 1. The cooling member 4 includes the cooling surface 41 that cools the heater element 2. The cooling surface 41 is provided on a surface of the cooling member 4 on the X1 direction side. The cooling surface 41 is arranged along a direction (Z direction) perpendicular to the main surfaces of the board 1. That is, the cooling surface 41 is arranged along a YZ plane. Furthermore, the cooling member 4 cools the heater element 2 by exchanging heat between the surface to be cooled 21b of the heater element 2 and the cooling surface 41 via the thermally conductive sheet 6 described below.

The urging member 5 fixes the heater element 2 in a state in which heat is transferable to the cooling member 4. That is, the urging member 5 arranges (fixes) the heater element 2 at a position at which the heater element 2 is cooled by the cooling surface 41 of the cooling member 4. Specifically, the urging member 5 presses the heater element 2 in order to bring the heater element 2 into close contact with the thermally conductive sheet 6. The urging member 5 urges the heater element 2 toward the cooling surface 41 (in an X2 direction) of the cooling member 4. The urging member 5 is a leaf spring made of metal such as stainless steel. Furthermore, the urging member 5 is fixed to the housing by a fastening member 5a such as a screw.

The thermally conductive sheet 6 is a thermal interface material. The thermally conductive sheet 6 is a flexible member arranged between the cooling surface 41 of the cooling member 4 and the heater element 2. The thermally conductive sheet 6 is configured so as not to cause a clearance between the heater element 2 and the thermally conductive sheet 6. Furthermore, the thermally conductive sheet 6 is flexible, and thus the clearance between the heater element 2 and the thermally conductive sheet 6 can be filled even when the clearance between the heater element 2 and the thermally conductive sheet 6 varies. The thermally conductive sheet 6 is a material that easily conducts heat. In addition, the thermally conductive sheet 6 is a material that insulates the heater element 2 from the cooling surface 41. Thus, the heater element 2 is pressed by the urging member 5 against the cooling surface 41 of the cooling member 4 via the thermally conductive sheet 6.

(Description of Mounting Structure for Heater Element)

The supporting member 3 is temporarily fixed to the board 1, as shown in FIG. 2. The supporting member 3 temporarily fixes the heater element 2. Specifically, the supporting member 3 includes the board mounts 32 that are detachably and temporarily fixed to the board 1. Furthermore, the supporting member 3 includes elastic legs 31 that temporarily fix (hold) the heater element 2. The supporting member 3 is temporarily fixed to the board 1 by the board mounts 32 while temporarily fixing the heater element 2 to restrict movement of the heater element 2. In the first embodiment, the supporting member 3 is mounted on the board 1 by two board mounts 32. The supporting member 3 is made of a resin such as polybutylene terephthalate (PBT).

The supporting member 3 temporarily fixes the heater element 2 by holding the heater element 2 while restricting movement of the heater element 2 along a direction (Z1 direction) away from the board 1. That is, the supporting member 3 holds the heater element 2 such that the lead terminals 22 of the heater element 2 are not spaced apart from (do not fall out of) positions (through-holes 1a) of the board 1 to which the lead terminals 22 are connected.

The supporting member 3 is mounted on the board 1 by the board mounts 32 while holding the plurality of heater elements 2 linearly aligned so as to restrict (temporarily fix) movement of each of the plurality of heater elements 2. Specifically, the supporting member 3 holds six heater elements 2 linearly aligned along a Y direction in an upright state.

Figure 3:
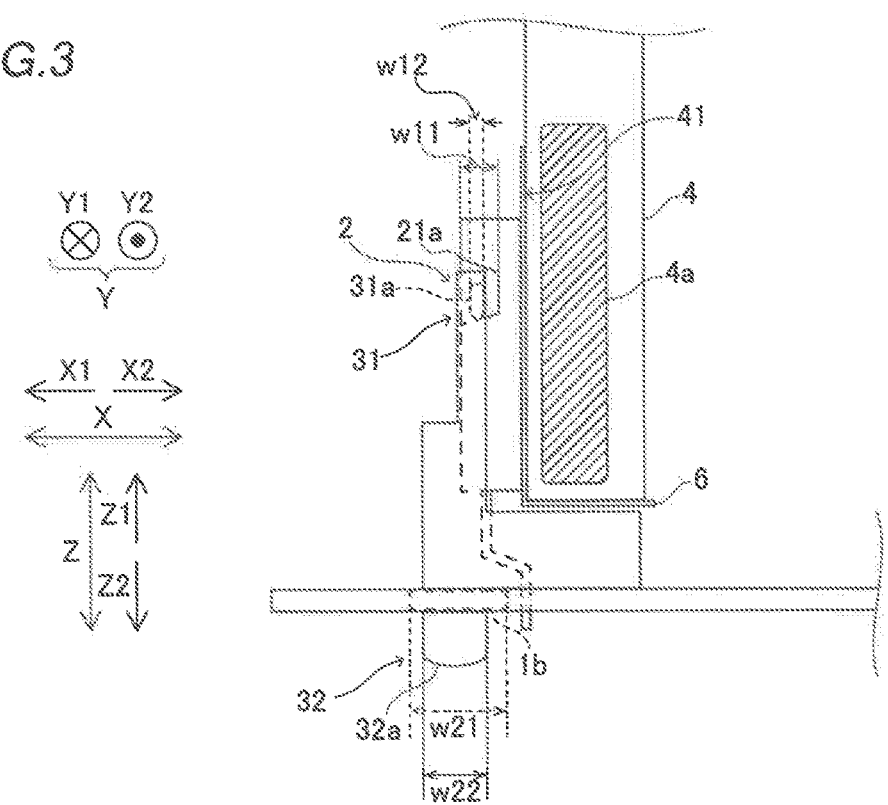
FIG. 3 is a side view for illustrating the supporting member according to the first embodiment.

As shown in FIG. 3, the supporting member 3 arranges the heater element 2 on the board 1 in a state in which a predetermined play (clearance) is provided such that the heater element 2 is movable in a direction (X2 direction) toward the cooling surface 41 of the cooling member 4. In the first embodiment, the supporting member 3 is temporarily fixed so as to stand upright from the board 1. The supporting member 3 temporarily fixes the heater element 2 such that the surface to be cooled 21b of the heater element 2 is along the direction (the direction along the YZ plane) perpendicular to the main surfaces of the board 1 and faces the cooling surface 41 of the cooling member 4. The supporting member 3 temporarily fixes the heater element 2 in a state in which the predetermined play (clearance) is provided such that the heater element 2 is movable along a direction (X2 direction) parallel to the main surfaces of the board 1 toward the cooling surface 41 of the cooling member 4. In FIG. 3, illustration of a portion of the configuration of the supporting member 3 is omitted.

In the first embodiment, the supporting member 3 temporarily fixes the heater element 2 in a state in which the predetermined play (clearance) is provided between the heater element 2 and the elastic legs 31. The elastic legs 31 hold the heater element 2 while restricting movement of the heater element 2 in a state in which the heater element 2 is movable a predetermined distance such that the surface to be cooled 21b of the heater element 2 is moved to the position at which the heater element 2 is cooled by the cooling surface 41 of the cooling member 4 arranged along the direction perpendicular to the main surfaces of the board 1 (parallel to the YZ plane). The elastic legs 31 of the supporting member 3 include element holding protrusions 31a that fit into the recesses 21a of the body 21 of the heater element 2. The element holding protrusions 31a are examples of a "protrusion" in the claims.

Specifically, the elastic legs 31 temporarily fix the heater element 2 by holding the heater element 2 in a state in which clearances are provided as predetermined plays between the element holding protrusions 31a and the recesses 21a such that the heater element 2 is movable in the X direction. That is, the widths w11 of the recesses 21a in the X direction are larger than the widths w12 of the element holding protrusions 31a in the X direction. The elastic legs 31 temporarily fix the heater element 2 such that the heater element 2 is movable, in the X direction, a distance corresponding to a clearance corresponding to a difference between the widths w11 of the recesses 21a and the widths w12 of the element holding protrusions 31a in the X direction. The elastic legs 31 temporarily fix the heater element 2 such that the heater element 2 is moved along the X direction to the position at which the heater element 2 is cooled by the cooling surface 41 of the cooling member 4 by being urged by the urging member 5. The elastic legs 31 hold the heater element 2 in a state in which the predetermined play (clearance) is provided between the elastic legs 31 and the heater element 2 so as to correspond to a variation in shape due to the fabrication tolerance of the heater element 2. The width (length) of the predetermined play (clearance) is 1 mm, for example.

There is almost no clearance in the Z direction between the element holding protrusions 31a and the recesses 21a, and the elastic legs 31 hold the heater element 2 while restricting movement of the heater element 2 in the Z1 direction. Therefore, the elastic legs 31 restrict movement of the heater element 2 in the Z direction and hold the heater element 2 in a state in which the heater element 2 is movable a distance corresponding to the predetermined play in the X direction.

Figure 4:
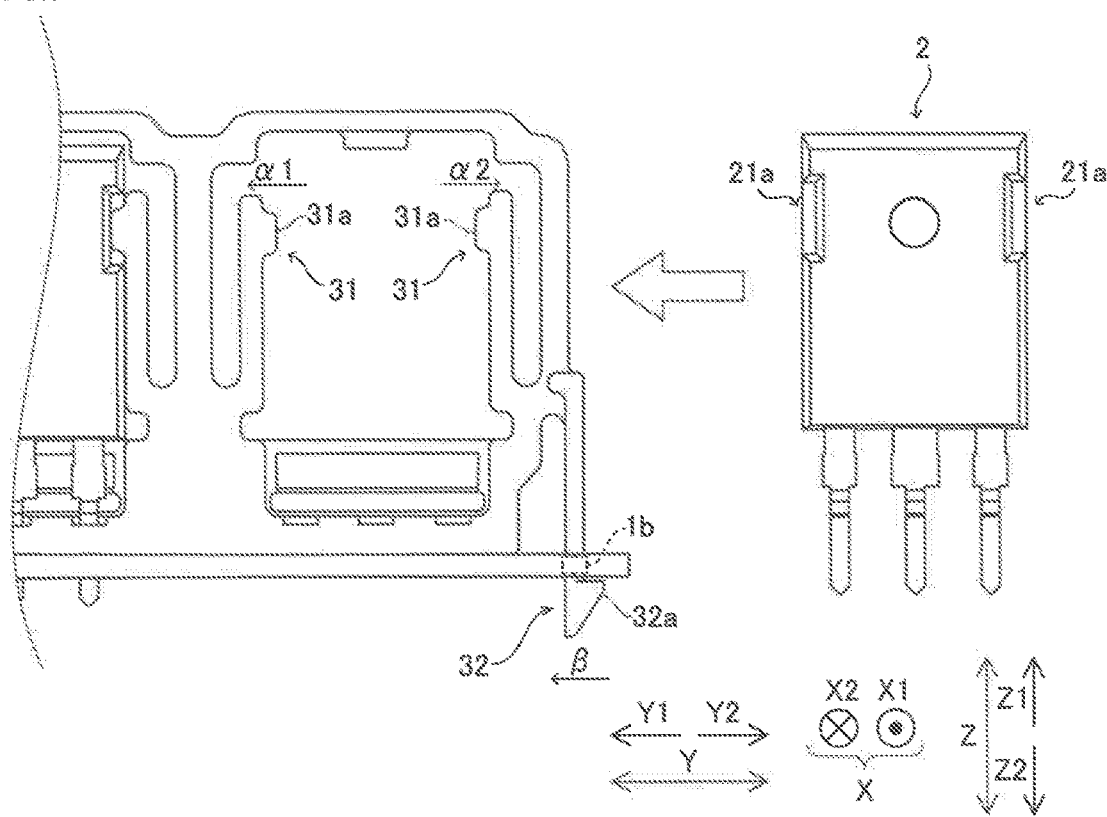
FIG. 4 is a front view for illustrating the supporting member according to the first embodiment.

As shown in FIG. 4, the elastic legs 31 temporarily fix the heater element 2 by a snap-fit structure in which the element holding protrusions 31a fit into the recesses 21a by elastic deformation. Each of the element holding protrusions 31a has a wedge shape (claw shape) that fits into each of the recesses 21a. Specifically, the element holding protrusions 31a, which are the tip ends of the elastic legs 31, fit into the recesses 21a while elastically deforming in an α1 direction and an α2 direction (a Y1 direction and a Y2 direction) in FIG. 4. The elastic legs 31 hold the heater element 2 while elastically deforming such that the elastic legs 31 are widened in a right-left direction with respect to a direction in which the heater element 2 is pushed when the heater element 2 is pushed in the X2 direction. The element holding protrusions 31a of the elastic legs 31 are chamfered so as to elastically deform in the α1 direction and the α2 direction when the heater element 2 is pushed in the X2 direction. The elastic legs 31 temporarily fix the heater element 2 by fitting two element holding protrusions 31a into each of the plurality of heater elements 2.

As shown in FIG. 3, in the first embodiment, the board mounts 32 are temporarily fixed to the board 1 by being detachably inserted into the holes 1b in a state in which predetermined plays (clearances) are provided between the holes 1b formed on the board 1 and the board mounts 32. The board mounts 32 are temporarily fixed to the board 1 so as to be movable along the elongated holes 1b. That is, the board mounts 32 are temporarily fixed to the board 1 such that the surface to be cooled 21b is movable along the direction (X direction) parallel to the main surfaces of the board 1. Therefore, the board mounts 32 are temporarily fixed to the board 1 such that the surface to be cooled 21b of the heater element 2 is movable to the position at which the heater element 2 is cooled by the cooling surface 41 of the cooling member 4 arranged along the direction perpendicular to the main surfaces of the board 1 (along the YZ plane).

Specifically, the board mounts 32 are temporarily fixed to and mounted on the board 1 in a state in which the clearances are provided as the predetermined plays between the holes 1b and the board mounts 32 such that the board mounts 32 are movable in the X direction. That is, the widths w21 of the holes 1b in the X direction are larger than the widths w22 in the X direction of portions of the board mounts 32 inserted into the holes 1b. The board mounts 32 are mounted on the board 1 so as to be movable, in the X direction, a distance corresponding to a clearance corresponding to a difference between the widths w21 of the holes 1b and the widths w22 in the X direction of the portions inserted into the holes 1b. The board mounts 32 are temporarily fixed to the board 1 so as to be movable in the X direction such that the heater element 2 is moved to the position at which the heater element 2 is cooled by the cooling surface 41 of the cooling member 4 by being urged by the urging member 5. The board mounts 32 are temporarily fixed to the board 1 in a state in which the clearances are provided between the board mounts 32 and the board 1 so as to correspond to a variation in shape due to the fabrication tolerance of the heater element 2. The widths (lengths) of the clearances are 1 mm, for example.

As shown in FIG. 4, the board mounts 32 include wedge-shaped board mounting protrusions 32a at the tip ends thereof. The board mounting protrusions 32a pass through the elongated holes 1b such that the board mounts 32 are temporarily fixed to the board 1. Similarly to the element holding protrusions 31a, the board mounting protrusions 32a are detachably inserted into the holes 1b by a snap-fit structure in which the board mounts 32 are elastically deformed to fit into the holes 1b of the board 1. Each of the board mounting protrusions 32a has a wedge shape that fits into each of the holes 1b. Specifically, the tip end of one of the board mounts 32 fits into the hole 1b while elastically deforming in a β direction (Y1 direction) in FIG. 4. The supporting member 3 is pushed in a Z2 direction such that the board mounts 32 are mounted on the board 1. The board mounting protrusion 32a of the board mount 32 is chamfered so as to elastically deform in the β direction when the supporting member 3 is pushed in the Z2 direction. The board mounting protrusions 32a are examples of a "protrusion" in the claims.

(Method for Mounting Heater Element According to First Embodiment)

Figure 5:
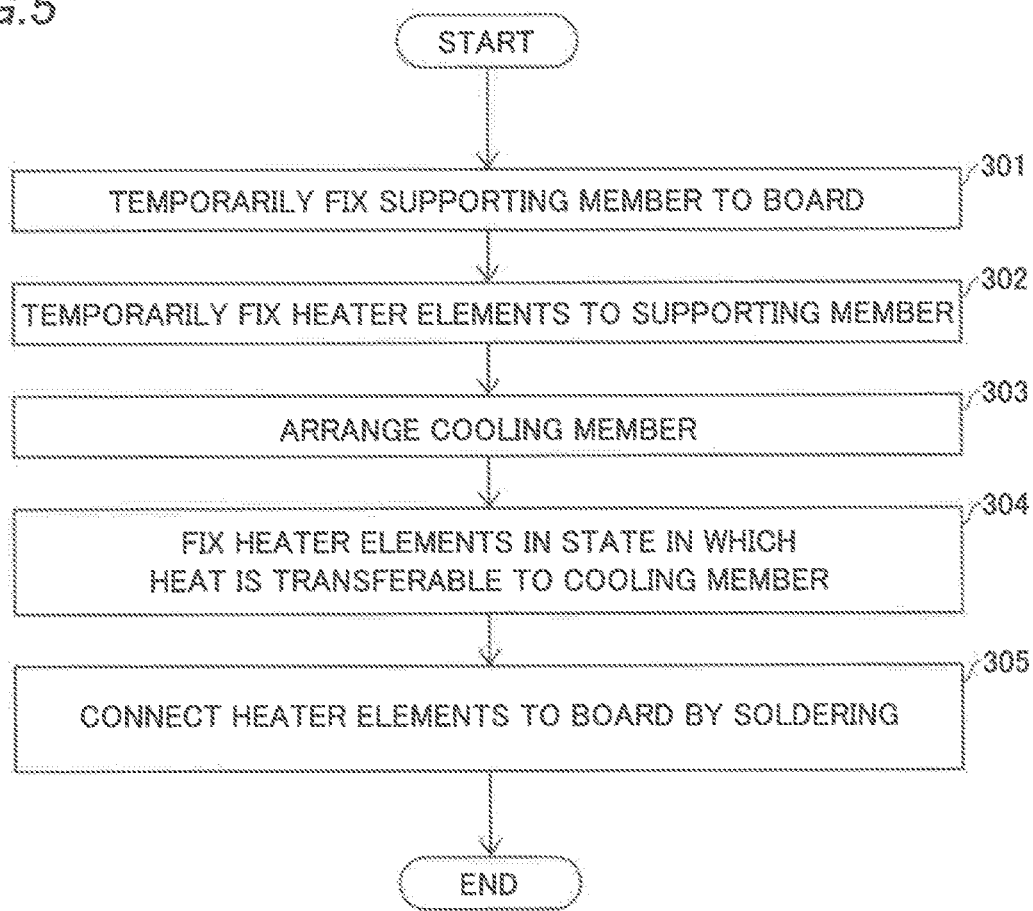
FIG. 5 is a flowchart for illustrating a method for mounting the heater element according to the first embodiment.

A method for mounting the heater element according to the first embodiment is now described with reference to FIG. 5.

First, in step 301, the board mounting projections 32a of the board mounts 32 are inserted into the holes 1b such that the supporting member 3 is temporarily fixed to a first surface (a surface on the Z1 direction side) of the main surfaces of the board 1 to which the heater elements 2 are connected.

Next, in step 302, the element holding protrusions 31a of the elastic legs 31 fit into the recesses 21a of the bodies 21 of the heater elements 2 such that the plurality of (six) heater elements 2 is temporarily fixed to the supporting member 3. That is, the heater elements 2 are temporarily fixed to the supporting member 3 temporarily fixed to the board 1 such that the heater elements 2 are arranged at predetermined positions (positions at which the heater elements 2 are connected by soldering) of the board 1.

Next, in step 303, the cooling member 4 that cools the surfaces to be cooled 21b of the heater elements 2 is arranged on the first surface side (Z1 direction side) of the main surfaces of the board 1.

Next, in step 304, the supporting member 3 is temporarily fixed to the board 1, and the heater elements 2 are temporarily fixed to the supporting member 3 such that the heater elements 2 with the lead terminals 22 inserted into the through-holes 1a formed on the board 1 are fixed in a state in which heat is transferable to the cooling member 4. Specifically, in a state in which the lead terminals 22 are inserted into the through-holes 1a formed on the board 1, each of the heater elements 2 is urged by the urging member 5 so as to be moved to the position at which the heater element 2 is cooled by the cooling surface 41 of the cooling member 4. That is, the heater element 2 is urged by the urging member 5 such that the surface to be cooled 21b of the heater element 2 is pressed against the thermally conductive sheet 6 arranged on the cooling surface 41 of the cooling member 4.

Next, in step 305, the lead terminals 22 of the heater elements 2 fixed in a state in which heat is transferable to the cooling member 4 are soldered to a second surface (a surface on the Z2 direction side) of the main surfaces of the board 1. That is, soldering is performed in a state in which the heater elements 2 have been moved toward the cooling surface 41 of the cooling member 4 such that the heater elements 2 are electrically connected to the board 1. That is, the supporting member 3 is mounted on the board 1, and the heater elements 2 are held by the supporting member 3 such that the heater elements 2 are electrically connected to the board 1 by soldering in a state in which the heater elements 2 are arranged on the board 1 while movement of the heater elements 2 are restricted.

Either step 301 in which the supporting member 3 is temporarily fixed to the board 1 or step 302 in which the heater elements 2 are temporarily fixed to the supporting member 3 may be performed first. That is, the supporting member 3 to which the heater elements 2 have been temporarily fixed may be temporarily fixed to the board 1.

Advantageous Effects of First Embodiment

According to the first embodiment, the following advantageous effects are achieved.

According to the first embodiment, as described above, the mounting structure for the heater element 2 includes the supporting member 3 that is temporarily fixed to the board 1 and temporarily fixes the heater element 2. Accordingly, the supporting member 3 is temporarily fixed at a predetermined position of the board 1 in a state in which the heater element 2 has been temporarily fixed by the supporting member 3, and thus the heater element 2 can be arranged at the predetermined position of the board 1 in a state in which the heater element 2 has been temporarily fixed. Therefore, the heater element 2 that has been temporarily fixed is arranged on the board 1 such that the possibility that the lead terminals 22 of the heater element 2 fall out of the board 1 can be significantly reduced or prevented, and the heater element 2 can be easily arranged at the predetermined position of the board 1. Consequently, when the heater element 2 is arranged on the board 1, assembly operation can be facilitated while the possibility that the heater element 2 falls out of the board 1 is significantly reduced or prevented.

According to the first embodiment, as described above, the supporting member 3 includes the board mounts 32 detachably fixed to the board 1, and the board mounts 32 are temporarily fixed to the board 1 by being detachably inserted into the holes 1b in a state in which the predetermined plays are provided between the holes 1b formed on the board 1 and the board mounts 23. Accordingly, the board mounts 32 are temporarily fixed to the board 1 in a state in which the predetermined plays are provided between the holes 1b formed on the board 1 and the board mounts 32, and thus the supporting member 3 can be temporarily fixed to the board 1 in a state in which the supporting member 3 is movable for a distance corresponding to the predetermined play with respect to the board 1. Therefore, the supporting member 3 is temporarily fixed to the board 1 in a movable state such that the heater element 2 temporarily fixed to the supporting member 3 can be arranged at the predetermined position of the board 1 in a movable state with respect to the board 1. Consequently, even when the shapes of the lead terminals 22 of the heater element 2 vary due to fabrication tolerance during manufacturing or deformation during transportation and storage, the heater element 2 can be moved closer to the cooling member 4, and thus the heater element 2 can be effectively cooled.

According to the first embodiment, as described above, the supporting member 3 temporarily fixes the heater element 2 by the snap-fit structure in a state in which the predetermined play is provided between the heater element 2 and the supporting member 3. Accordingly, the heater element 2 can be temporarily fixed to the supporting member 3 by the snap-fit structure, and thus the heater element 2 can be easily temporarily fixed as compared with a case in which the heater element 2 is temporarily fixed by a fastening member such as a screw.

According to the first embodiment, as described above, the supporting member 3 includes the elastic legs 31 including the element holding protrusions 31a (protrusions), and the elastic legs 31 temporarily fix the heater element 2 by the snap-fit structure in which the element holding protrusions 31a fit into the recesses 21a formed in advance on the heater element 2 in a state in which the predetermined play is provided between the heater element 2 and the elastic legs 31. Accordingly, the element holding protrusions 31a of the elastic legs 31 fit into the recesses 21a formed in advance on the heater element 2 such that the heater element 2 can be reliably held. Furthermore, the element holding protrusions 31a of the elastic legs 31 fit into the recesses 21a of the heater element 2 such that the possibility that the lead terminals 22 of the heater element 2 fall out of the board 1 can be effectively significantly reduced or prevented. Moreover, the heater element 2 is temporarily fixed in a state in which the predetermined play is provided between the heater element 2 and the elastic legs 31, and thus the surface to be cooled 21b of the heater element 2 is moved to the position at which the heater element 2 is cooled by the cooling member 4 such that the heater element 2 can be effectively cooled while the possibility that the lead terminals 22 of the heater element 2 fall out of the board 1 is effectively significantly reduced or prevented.

According to the first embodiment, as described above, the heater element 2 is a semiconductor element, and is mounted on the board 1 included in the power conversion device 100 that performs power conversion by being temporarily fixed by the supporting member 3. Accordingly, even when the heater element 2 is a semiconductor element mounted on the board 1 included in the power conversion device 100 that performs power conversion, operation to assemble the power conversion device 100 can be facilitated while the possibility that the heater element 2 falls out of the board 1 is significantly reduced or prevented.

According to the first embodiment, as described above, the supporting member 3 stands upright from the board 1, and temporarily fixes the heater element 2 such that the surface to be cooled 21b of the heater element 2 is along the direction perpendicular to the main surfaces of the board 1. Accordingly, when the cooling surface 41 of the cooling member 4 is arranged along the direction perpendicular to the main surfaces of the board 1, the surface to be cooled 21*b* of the heater element 2 can be arranged at the position at which the heater element 2 is cooled by the cooling surface 41 of the cooling member 4. Therefore, even when the cooling surface 41 of the cooling member 4 is arranged in the direction perpendicular to the main surfaces of the board 1, the heater element 2 can be effectively cooled.

According to the first embodiment, as described above, the supporting member 3 includes the board mounts 32 detachably and temporarily fixed to the board 1 and including the wedge-shaped protrusions 32*a* (protrusions) at the tip ends thereof, and the board mounting protrusions 32*a* pass through the elongated holes 1*b* in a state in which the predetermined plays are provided between the elongated holes 1*b* formed on the board 1 and the board mounts 32 such that the board mounts 32 are temporarily fixed to the board 1. Accordingly, the predetermined plays are provided between the elongated holes 1*b* formed on the board 1 and the board mounts 32, and thus the surface to be cooled 21*b* of the heater element 2 can be moved to the position at which the heater element 2 is cooled by the cooling member 4 by moving the board mounts 32 along the elongated holes 1*b*. Therefore, the board mounts 32 are moved along the elongated holes 1*b* formed on the board 1, and thus the moving directions of the board mounts 32 can be constant. Consequently, the surface to be cooled 21*b* of the heater element 2 can be easily moved to the position at which the heater element 2 is cooled by the cooling surface 41 of the cooling member 4.

In the method for mounting the element according to the first embodiment, as described above, the supporting member 3 is temporarily fixed to the board 1, and the heater element 2 is temporarily fixed to the supporting member 3 such that the heater element 2 with the lead terminals 22 inserted into the through-holes 1*a* formed on the board 1 is fixed in a state in which heat is transferable to the cooling member 4. Then, the lead terminals 22 of the heater element 2 fixed in a state in which heat is transferable to the cooling member 4 are soldered to the second surface of the main surfaces of the board 1. Accordingly, the heater element 2 can be soldered in a state in which the heater element 2 is temporarily fixed to the supporting member 3 and arranged on the board 1, and thus an operator can solder the heater element 2 to the board 1 in a state in which the heater element 2 is stably arranged on the board 1. Therefore, the heater element 2 can be soldered in a state in which the possibility that the lead terminals 22 of the heater element 2 fall out of the board 1 is significantly reduced or prevented. Thus, it is possible to provide the method for mounting the heater element that facilitates assembly operation while significantly reducing or preventing the possibility that the heater element 2 falls out of the board 1 when the heater element 2 is arranged on the board 1. Furthermore, the heater element 2 can be arranged at the position at which the heater element 2 is cooled by the cooling member 4 before the soldering, and thus movement (urging) of the heater element 2 to the position for cooling after the soldering can be significantly reduced or prevented. Therefore, application of a stress to the solder due to movement of the heater element 2 after the soldering can be significantly reduced or prevented. Consequently, assembly can be performed such that a stress is not applied to the solder, and thus a burden on the connection between the heater element 2 and the board 1 can be effectively significantly reduced or prevented.

Second Embodiment

The configuration of a power conversion device 200 according to a second embodiment is now described with reference to FIGS. 6 to 9. In the second embodiment, heater elements 202 are arranged such that surfaces to be cooled 221*b* of the heater elements 202 are along directions parallel to main surfaces of a board 201, unlike the first embodiment in which the heater elements 2 are arranged such that the surfaces to be cooled 21*b* of the heater elements 2 are along the direction perpendicular to the main surfaces of the board 1. The same or similar configurations as those of the first embodiment are denoted by the same reference numerals, and description thereof is omitted.

(Configuration of Power Conversion Device in which Mounting Structure for Heater Element is Provided According to Second Embodiment)

Figure 6:
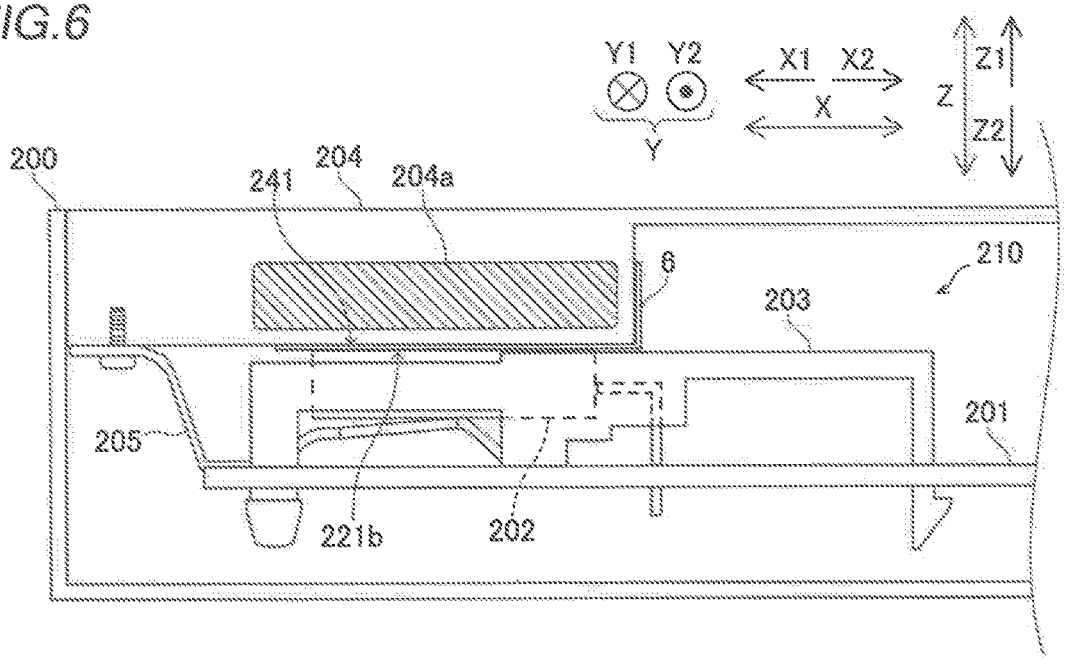
FIG. 6 is a side view for illustrating the configuration of a power conversion device in which a mounting structure for a heater element is provided according to a second embodiment.

As shown in FIG. 6, the power conversion device 200 in which a mounting structure for a heater element is provided according to the second embodiment is an inverter device mounted on an electric vehicle similarly to the first embodiment. The power conversion device 200 includes a power converter 210. Similarly to the first embodiment, the power converter 210 performs power conversion operation to convert DC power into AC power. The power converter 210 includes the board 201, a plurality of heater elements 202, a supporting member 203, a cooling member 204, and an urging member 205.

Figure 7:
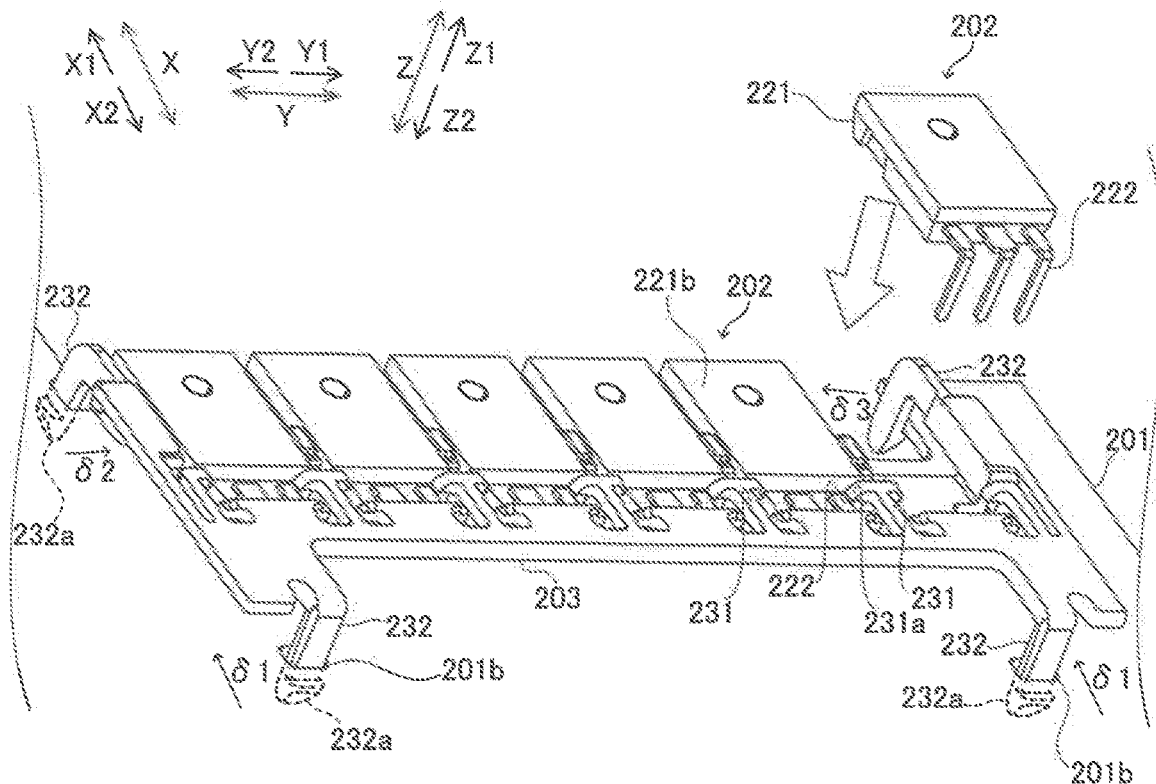
FIG. 7 is a perspective view for illustrating the configuration of a supporting member according to the second embodiment.

As shown in FIG. 7, the plurality of heater elements 202 is mounted on the board 201 similarly to the board 1 according to the first embodiment. The board 201 includes holes 201*b* provided at predetermined positions of the board 201 such that board mounts 232 of the supporting member 203 described below are inserted thereinto. The holes 201*b* pass through the main surfaces (surfaces along an XY plane) of the board 201 in a Z direction.

The heater elements 202 are semiconductor elements (switching elements) for performing power conversion, which constitute the power converter 210, similarly to the heater elements 2 according to the first embodiment. Each of the heater elements 202 includes an IGBT, for example. The heater elements 202 generate heat by switching.

As shown in FIG. 7, each of the heater elements 202 includes a flat rectangular parallelepiped body 221 and three lead terminals 222 connected to the board 201. The heater element 202 has, on a back surface (a surface on the Z1 side) of the body 221, a surface to be cooled 221*b* that is cooled by a cooling surface 241 of the cooling member 204 described below. That is, the surface to be cooled 221*b* is cooled by the cooling surface 241 of the cooling member 204 such that the heater element 202 is cooled. In the second embodiment, the heater element 202 is bent such that the lead terminals 222 are along a direction (Z direction) perpendicular to the main surfaces (surfaces along the XY plane) of the board 201. That is, each of the lead terminals 222 of the heater element 202 includes a portion that extends from the body 221 in a direction (X2 direction) parallel to the main surfaces of the board 201 and a portion that is bent and extends in the direction (Z2 direction) perpendicular to the main surfaces of the board 201.

As shown in FIG. 6, the cooling member 204 is a portion of a housing of the power conversion device 200. Inside the cooling member 204, a flow path 204*a* through which cooling water for cooling the heater elements 202 flows is provided. The cooling member 204 includes the cooling surface 241 that cools the heater elements 202. The cooling surface 241 is provided on a surface of the cooling member 204 on the Z2 direction side. That is, in the second embodiment, the cooling surface 241 is arranged along the directions parallel to the main surfaces of the board 201 (along the XY plane). Furthermore, the cooling member 204 cools the heater elements 202 by exchanging heat between the surfaces to be cooled 221b of the heater elements 202 and the cooling surface 241 via a thermally conductive sheet 6, similarly to the first embodiment.

The urging member 205 arranges (fixes) the heater element 202 at a position at which the heater element 202 is cooled by the cooling surface 241 of the cooling member 204, similarly to the urging member 5 according to the first embodiment. That is, the urging member 205 presses the heater element 202 in order to bring the heater element 202 into close contact with the thermally conductive sheet 6.

(Description of Mounting Structure for Heater Element According to Second Embodiment)

As shown in FIG. 7, the supporting member 203 includes the board mounts 232 detachably and temporarily fixed to the board 201, and elastic legs 231 that temporarily fix the heater element 202. Furthermore, the supporting member 203 temporarily fixes six heater elements 202 linearly aligned sideways (on their sides) to the main surfaces of the board 201. In the second embodiment, the supporting member 203 is temporarily fixed to the board 201 by four board mounts 232.

Figure 8:
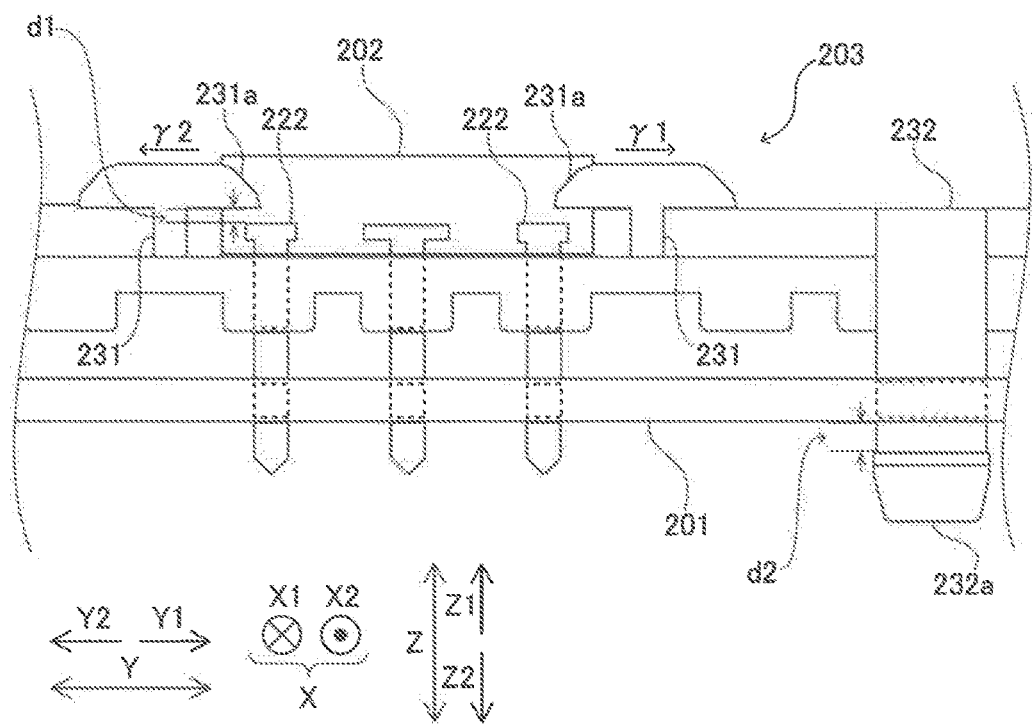
FIG. 8 is a diagram for illustrating fitting of elastic legs and a board mount according to the second embodiment.

As shown in FIGS. 7 and 8, in the second embodiment, the supporting member 203 arranges the heater element 202 on the board 201 in a state in which a predetermined play (clearance) is provided such that the heater element 202 is movable in a direction (Z1 direction) toward the cooling surface 241 of the cooling member 204. Furthermore, the supporting member 203 is provided along the board 201. The supporting member 203 temporarily fixes the heater element 202 such that the surface to be cooled 221b of the heater element 202 is along the directions (X and Y directions) parallel to the main surfaces of the board 201 so as to face the cooling surface 241 of the cooling member 204. The supporting member 203 temporarily fixes the heater element 202 in a state in which the predetermined play (clearance) is provided such that the heater element 202 is movable along the direction (Z1 direction) perpendicular to the main surfaces of the board 201 toward the cooling surface 241 of the cooling member 204. In FIG. 8, illustration of a portion of the configuration of the supporting member 203 is omitted.

In the second embodiment, the elastic legs 231 fit to the portions of the bent lead terminals 222 of the heater element 202 that extend along the direction (X2 direction) parallel to the main surfaces of the board 201. The elastic legs 231 hold the heater element 202 while restricting movement of the heater element 202 in a state in which the heater element 202 is movable a predetermined distance such that the surface to be cooled 221b of the heater element 202 is moved to a position at which the heater element 202 is cooled by the cooling surface 241 of the cooling member 204 arranged along the direction parallel to the main surfaces of the board 201 (parallel to the XY plane). The elastic legs 231 of the supporting member 203 include element holding protrusions 231a that fit into the lead terminals 222 of the heater element 202. The element holding protrusions 231a are examples of a "protrusion" in the claims.

Specifically, as shown in FIG. 8, the elastic legs 231 temporarily fix the heater element 202 by holding the heater element 202 in a state in which a clearances d1 is provided as the predetermined play between the elastic legs 231 and the lead terminals 222 such that the heater element 202 is movable in the Z direction. The elastic legs 231 temporarily fix the heater element 202 such that the heater element 202 is movable a distance corresponding to the clearance d1 between the element holding protrusions 231a and the lead terminals 222 in the Z direction. The elastic legs 231 temporarily fix the heater element 202 such that the heater element 202 is moved along the Z direction to the position at which the heater element 202 is cooled by the cooling surface 241 of the cooling member 204 by being urged by the urging member 205. The elastic legs 231 hold the heater element 202 in a state in which the predetermined play (clearance d1) is provided between the element holding protrusions 231a and the lead terminals 222 of the heater element 202 so as to correspond to a variation in shape due to the fabrication tolerance of the heater element 202. The width (length) of the predetermined play (clearance d1) is 1 mm, for example.

The elastic legs 231 hold the heater element 202 while restricting movement of the heater element 202 in the Z1 direction with the element holding protrusions 231a such that the heater element 202 is not spaced apart from the board 201 by a distance larger than the clearance d1. Therefore, the elastic legs 231 hold the heater element 202 while restricting movement of the heater element 202 in the Z1 direction by the distance larger than the clearance d1 in a state in which the heater element 202 is movable for a predetermined distance (clearance d1) in the Z direction.

Similarly to the first embodiment, the elastic legs 231 temporarily fix the heater element 202 by a snap-fit structure in which the element holding protrusions 231a fit to the lead terminals 222 by elastic deformation. Each of the element holding protrusions 231a has a wedge shape (claw shape) that fits to each of the lead terminals 222. Specifically, the tip ends of the elastic legs 231 fit to the lead terminals 222 while elastically deforming in a γ1 direction and a γ2 direction (a Y1 direction and a Y2 direction) in FIG. 8. That is, the elastic legs 231 hold the heater element 202 while elastically deforming such that the elastic legs 231 are widened in a right-left direction with respect to a direction in which the heater element 202 is pushed when the heater element 202 is pushed in the Z2 direction. The element holding protrusions 231a of the elastic legs 231 are chamfered so as to be elastically deformed when the heater element 202 is pushed in the Z2 direction.

In the second embodiment, the board mounts 232 include wedge-shaped board mounting protrusions 232a at the tip ends thereof. The board mounting protrusions 232a pass through the holes 201b in a state in which predetermined plays (clearances) are provided between the holes 201b formed on the board 201 and the board mounting protrusions 232a such that the board mounts 232 are temporarily fixed to the board 201. The board mounts 232 are temporarily fixed to the board 201 such that the surface to be cooled 221b of the heater element 202 is movable along the direction (Z direction) perpendicular to the main surfaces of the board 201. Therefore, the board mounts 232 are temporarily fixed to the board 201 such that the surface to be cooled 221b of the heater element 202 is movable to the position at which the heater element 202 is cooled by the cooling surface 241 of the cooling member 204 arranged along the direction parallel to the main surfaces of the board 201 (along the XY plane). The board mounting protrusions 232a are examples of a "protrusion" in the claims.

Specifically, the board mounts 232 are temporarily fixed to and mounted on the board 201 in a state in which clearances d2 are provided as the predetermined plays between the board mounting protrusions 232a and the board 201 such that the board mounts 232 are movable in the Z direction. The board mounts 232 are temporarily fixed to the board 201 so as to be movable in the Z direction such that the heater element 202 is moved to the position at which the heater element 202 is cooled by the cooling surface 241 of the cooling member 204 by being urged by the urging member 205. The board mounts 232 are temporarily fixed to the board 201 in a state in which the clearances d2 are provided between the board mounts 232 and the board 201 so as to correspond to a variation in shape due to the fabrication tolerance of the heater element 202. The widths (lengths) of the clearances d2 are 1 mm, for example.

As shown in FIG. 7, similarly to the element holding protrusions 231a, the board mounting protrusions 232a are detachably inserted into the holes 201b by a snap-fit structure in which the board mounts 232 are elastically deformed to fit into the holes 201b of the board 201. Each of the board mounting protrusions 232a has a wedge shape that fits into each of the holes 201b. Specifically, the tip end of each of the four board mounts 232 fits into the hole 201b while elastically deforming in a δ1 direction (X1 direction), a δ2 direction (Y1 direction), or a δ3 direction (Y2 direction) in FIG. 7. The supporting member 203 is pushed in the Z2 direction such that the board mounts 232 are mounted on the board 201. The board mounting protrusion 232a of the board mount 232 is chamfered so as to elastically deform in the δ1 direction, the δ2 direction, or the δ3 direction when the supporting member 203 is pushed in the Z2 direction.

Figure 9:
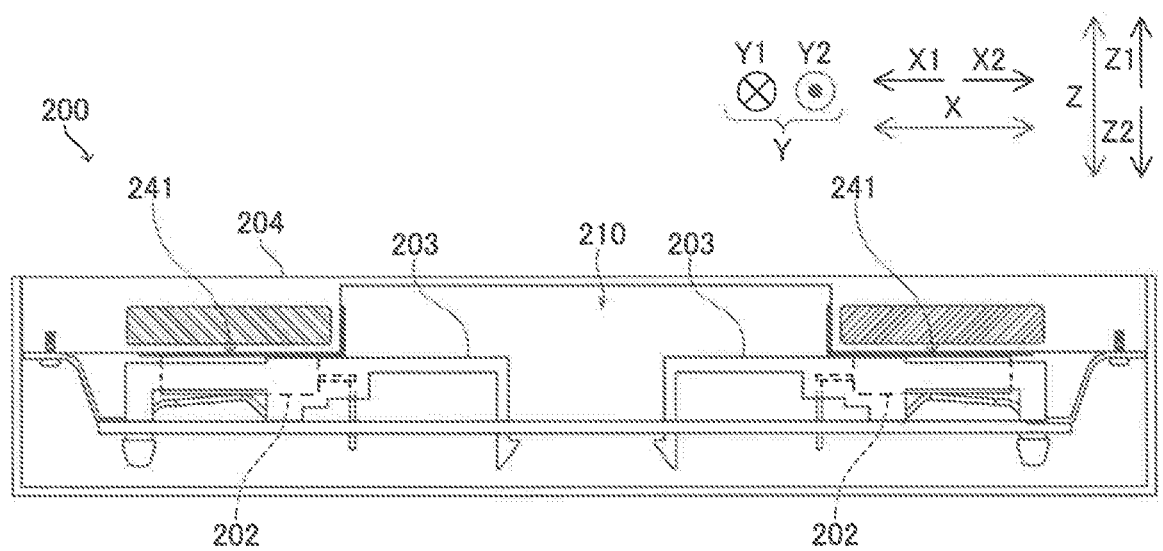
FIG. 9 is a diagram for illustrating a configuration in which a plurality of supporting members is provided according to the second embodiment.

As shown in FIG. 9, the supporting member 203 includes a plurality of supporting members 203 provided along the cooling surface 241 of the cooling member 204. For example, the power converter 210 includes two supporting members 203. Each of the two supporting members 203 is aligned in the X direction and temporarily fixed to the board 201. Furthermore, each of the two supporting members 203 temporarily fixes the six heater elements 202. Therefore, the two supporting members 203 are provided along the cooling surface 241 of the cooling member 204 such that twelve heater elements 202 are temporarily fixed to the two supporting members 203 and arranged at positions at which the heater elements 202 are cooled by the cooling surface 241.

The remaining configurations of the second embodiment are similar to those of the first embodiment.

Advantageous Effects of Second Embodiment

According to the second embodiment, the following advantageous effects are achieved.

According to the second embodiment, as described above, the supporting member 203 is provided along the board 201, and temporarily fixes the heater elements 202 such that the surfaces to be cooled 221b of the heater elements 202 are along the direction parallel to the main surfaces of the board 201. Accordingly, when the cooling surface 241 of the cooling member 204 is arranged along the direction parallel to the main surfaces of the board 201, the surfaces to be cooled 221b of the heater elements 202 can be arranged at the positions at which the heater elements 202 are cooled by the cooling surface 241 of the cooling member 204. Therefore, even when the cooling surface 241 of the cooling member 204 is arranged in the direction parallel to the main surfaces of the board 201, the heater elements 202 can be effectively cooled.

According to the second embodiment, as described above, the supporting member 203 includes the board mounts 232 that are detachably and temporarily fixed to the board 201 and include the wedge-shaped board mounting protrusions 232a (protrusions) at the tip ends thereof, and the board mounting protrusions 232a pass through the holes 201b in a state in which the predetermined plays are provided between the holes 201b formed on the board 201 and the board mounting protrusions 232a such that the board mounts 232 are temporarily fixed to the board 201. Accordingly, the predetermined plays are provided between the holes 201b formed on the board 201 and the board mounting protrusions 232a, and thus the supporting member 203 can be moved along the direction perpendicular to the main surfaces of the board 201. Therefore, the supporting member 203 can be easily moved in the direction perpendicular to the main surfaces of the board 201 while movement of the board mounts 232 in the direction parallel to the main surfaces of the board 201 is significantly reduced or prevented by the holes 201b provided on the board 201. Consequently, the moving directions of the board mounts 232 can be constant, and thus the surfaces to be cooled 221b of the heater elements 202 can be easily moved to the positions at which the heater elements 202 are cooled by the cooling surface 241 of the cooling member 204.

According to the second embodiment, as described above, the supporting member 203 includes the plurality of supporting members 203 provided along the cooling surface 241 of the cooling member 204. Accordingly, the plurality of supporting members 203 provided along the cooling surface 241 of the cooling member 204 allows the plurality of heater elements 202 to be arranged along the cooling surface 241 of the cooling member 204. Therefore, even when the plurality of heater elements 202 is arranged on the board 201, the plurality of heater elements 202 can be easily arranged at the positions at which the heater elements 202 are cooled by the cooling member 204.

The remaining advantageous effects of the second embodiment are similar to those of the first embodiment.

Modified Examples

The embodiments disclosed this time must be considered as illustrative in all points and not restrictive. The scope of the present invention is not shown by the above description of the embodiments but by the scope of claims for patent, and all modifications (modified examples) within the meaning and scope equivalent to the scope of claims for patent are further included.

For example, while the supporting member is mounted on the board by the board mounts in a state in which the plurality of heater elements (elements) is linearly aligned and held by the elastic legs such that movement of each of the plurality of elements is restricted in each of the aforementioned first and second embodiments, the present invention is not restricted to this. For example, the supporting member may alternatively temporarily fix one heater element.

While the elastic legs temporarily fix the heater elements in a state in which the predetermined plays are provided between the heater elements and the elastic legs in each of the aforementioned first and second embodiments, the present invention is not restricted to this. For example, the elastic legs may alternatively hold the heater elements such that the heater elements do not move, and only the board mounts may alternatively be movable with respect to the board due to the provided predetermined plays.

While the supporting member is detachably and temporarily fixed to the board in each of the aforementioned first and second embodiments, the present invention is not restricted to this. For example, the supporting member may alternatively be undetachably mounted on the board.

While the board mounts are temporarily fixed to the board in a state in which the predetermined plays are provided between the holes formed on the board and the board mounts in each of the aforementioned first and second embodiments, the present invention is not restricted to this. For example, the board mounts may alternatively be immovably mounted on the board, and the elastic legs may alternatively hold the heater elements such that the heater elements are movable due to the provided predetermined plays.

While the supporting member arranges the heater elements such that the heater elements are movable along the direction parallel to the main surfaces of the board toward the cooling surface of the cooling member in the aforementioned first embodiment, the present invention is not restricted to this. For example, the heater elements may alternatively rotate toward the cooling surface with portions connected to the board as fulcrums.

While the elastic legs fit into the recesses of the heater elements in the aforementioned first embodiment, the present invention is not restricted to this. For example, the elastic legs may alternatively fit to bodies other than the recesses. Furthermore, the elastic legs may alternatively fit to the lead terminals.

While the board mounts fit into the elongated holes in the aforementioned first embodiment, the present invention is not restricted to this. For example, the board mounts may alternatively fit to ends of the board.

While the cooling surface of the cooling member is arranged along the direction parallel to the main surfaces of the board in the aforementioned second embodiment, the present invention is not restricted to this. For example, the cooling surface may alternatively be arranged at an oblique position with respect to the main surfaces of the board.

While the supporting member temporarily fixes the heater elements including the lead terminals bent along the direction perpendicular to the main surfaces of the board in the aforementioned second embodiment, the present invention is not restricted to this. For example, the supporting member may alternatively temporarily fix the heater elements including the lead terminals not bent perpendicularly but gradually curved.

While the supporting member includes the elastic legs that temporarily fix the heater elements by the snap-fit structure and the board mounts temporarily fixed to the board by the snap-fit structure in each of the aforementioned first and second embodiments, the present invention is not restricted to this. For example, the supporting member may alternatively temporarily fix the heater elements by fastening members such as screws. Furthermore, the supporting member may alternatively be temporarily fixed to the board by a fastening member such as a screw. In addition, the supporting member may alternatively be temporarily fixed to the board using an adhesive.

While the heater elements are connected to the board mounted on the vehicle in each of the aforementioned first and second embodiments, the present invention is not restricted to this. For example, the heater elements may alternatively be connected to a board included in a stationary uninterruptible power supply.

While each of the heater elements (elements) is urged by the urging member so as to be pressed against the cooling surface of the cooling member via the thermally conductive sheet and fixed to the position at which the heater element is cooled in each of the aforementioned first and second embodiments, the present invention is not restricted to this. For example, the heater element may alternatively be fixed to the cooling surface of the cooling member by a fastening member such as a screw. Furthermore, the heater element may alternatively be cooled by directly contacting the cooling surface of the cooling member without using the thermally conductive sheet.

While the supporting member arranges the heater elements (elements) at the positions at which the heater elements are cooled by the cooling member formed integrally with the housing of the power conversion device, which is a water-cooled device in each of the aforementioned first and second embodiments, the present invention is not restricted to this. For example, the supporting member may alternatively arrange the heater elements so as to be cooled by a heat radiating member such as a heat sink formed separately from the housing.

What is claimed is:

1. A mounting structure for a heater element, the mounting structure comprising:
   a heater element including a surface to be cooled;
   a board on which the heater element is mounted;
   a cooling member that cools the surface to be cooled of the heater element mounted on the board; and
   a supporting member temporarily fixed to the board, the supporting member temporarily fixing the heater element.

2. The mounting structure for a heater element according to claim 1, wherein
   the supporting member includes a board mount detachably and temporarily fixed to the board; and
   the board mount is temporarily fixed to the board such that a predetermined play is provided between a hole and the board mount.

3. The mounting structure for a heater element according to claim 1, wherein the supporting member has a snap-fit structure to temporarily fix the heater element such that a predetermined play is provided between the heater element and the supporting member.

4. The mounting structure for a heater element according to claim 3, wherein
   the supporting member includes an elastic leg having a protrusion; and
   the elastic leg has a snap-fit structure in which the protrusion fits into a recess formed in advance on the heater element to temporarily fix the heater element such that a predetermined play is provided between the heater element and the elastic leg.

5. The mounting structure for a heater element according to claim 1, wherein the heater element is a semiconductor element, and is mounted on the board included in a power conversion device that performs power conversion by being temporarily fixed by the supporting member.

6. The mounting structure for a heater element according to claim 1, wherein the supporting member stands upright from the board, and temporarily fixes the heater element such that the surface to be cooled of the heater element is along a direction perpendicular to main surfaces of the board.

7. The mounting structure for a heater element according to claim 6, wherein
   the supporting member includes a board mount detachably and temporarily fixed to the board, the board mount including a wedge-shaped protrusion at a tip end thereof; and
   the wedge-shaped protrusion passes through an elongated hole formed on the board to have a predetermined play provided between the elongated hole and the board mount such that the board mount is temporarily fixed to the board.

8. The mounting structure for a heater element according to claim 1, wherein the supporting member is provided along the board, and temporarily fixes the heater element such that the surface to be cooled of the heater element is along a direction parallel to main surfaces of the board.

9. The mounting structure for a heater element according to claim 8, wherein
- the supporting member includes a board mount detachably and temporarily fixed to the board, the board mount including a wedge-shaped protrusion at a tip end thereof; and
- the wedge-shaped protrusion passes through a hole formed on the board to have a predetermined play is provided between the hole and the wedge-shaped protrusion such that the board mount is temporarily fixed to the board.

10. The mounting structure for a heater element according to claim 1, wherein the supporting member includes a plurality of supporting members provided along a cooling surface of the cooling member.

11. A method for mounting a heater element, the method comprising:
- temporarily fixing a supporting member to a first surface of main surfaces of a board;
- temporarily fixing a heater element including a surface to be cooled to the supporting member;
- arranging, on a side of the first surface of the main surfaces of the board, a cooling member that cools the surface to be cooled of the heater element;
- temporarily fixing the supporting member to the board and temporarily fixing the heater element to the supporting member;
- fixing the heater element with a lead terminal inserted into a through-hole formed on the board so that heat is transferable to the cooling member; and
- soldering, to a second surface of the main surfaces of the board, the lead terminal of the heater element fixed in the state in which heat is transferable to the cooling member.

12. A power conversion device comprising:
- a heater element including a surface to be cooled;
- a board on which the heater element is mounted;
- a cooling member that cools the surface to be cooled of the heater element mounted on the board; and
- a supporting member temporarily fixed to the board, the supporting member temporarily fixing the heater element.

* * * * *